United States Patent [19]

Takeuchi et al.

[11] Patent Number: 5,351,185
[45] Date of Patent: Sep. 27, 1994

[54] MALFUNCTION CHECKING CONTROL SYSTEM WHICH CHECKS IDENTIFICATION DATA STORED IN RAM

[75] Inventors: Kunihiro Takeuchi; Hideki Ishizuka; Hideyuki Kaneko, all of Saitama, Japan

[73] Assignee: Airbag Systems Company Ltd., Gumma, Japan

[21] Appl. No.: 878,977

[22] Filed: May 6, 1992

[30] Foreign Application Priority Data

May 17, 1991 [JP] Japan .................... 3-141438

[51] Int. Cl.⁵ .................................. B60R 21/02
[52] U.S. Cl. .............................. 364/184; 364/424.05; 280/735; 180/282; 340/436
[58] Field of Search ................. 364/184–186, 364/424.05; 340/436, 438; 307/9.1, 10.1; 180/232, 271, 282; 280/728, 734, 735

[56] References Cited

U.S. PATENT DOCUMENTS

| | | | |
|---|---|---|---|
| 4,873,452 | 10/1989 | Morota | 307/10.1 |
| 4,950,914 | 8/1990 | Kurihara et al. | 307/10.1 |
| 5,182,755 | 1/1993 | Sekiguchi et al. | 371/16.3 |

FOREIGN PATENT DOCUMENTS

| | | |
|---|---|---|
| 3820534 | 1/1989 | Fed. Rep. of Germany . |
| 61-202233 | 9/1986 | Japan . |
| 64-18851 | 1/1989 | Japan . |
| 2-193743 | 7/1990 | Japan . |

*Primary Examiner*—Jerry Smith
*Assistant Examiner*—Cameron H. Tousi
*Attorney, Agent, or Firm*—Fish & Richardson

[57] ABSTRACT

A system for controlling an object such as a vehicle safety device comprises a microcomputer, and reset circuits. The microcomputer judges whether or not an identification data is stored in a specific area of the RAM in order to identify the kind of the resetting method. If the judgment result is "NO", the object is controlled after an early judgment of the control system is effected. In contrast, if the judgment result is "YES", the object is controlled without effecting the early checking.

7 Claims, 3 Drawing Sheets

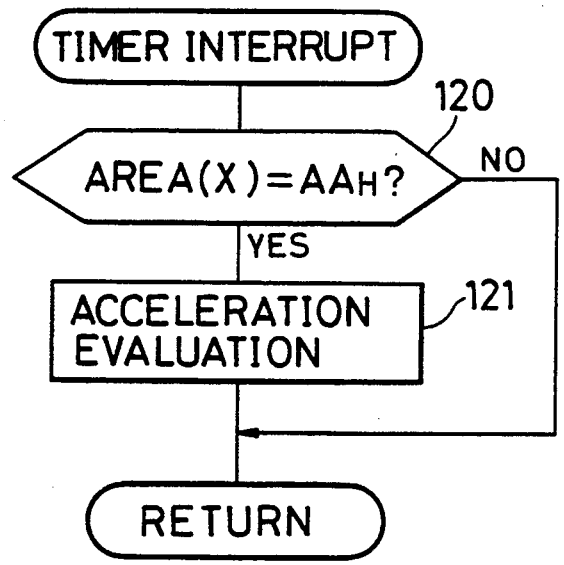
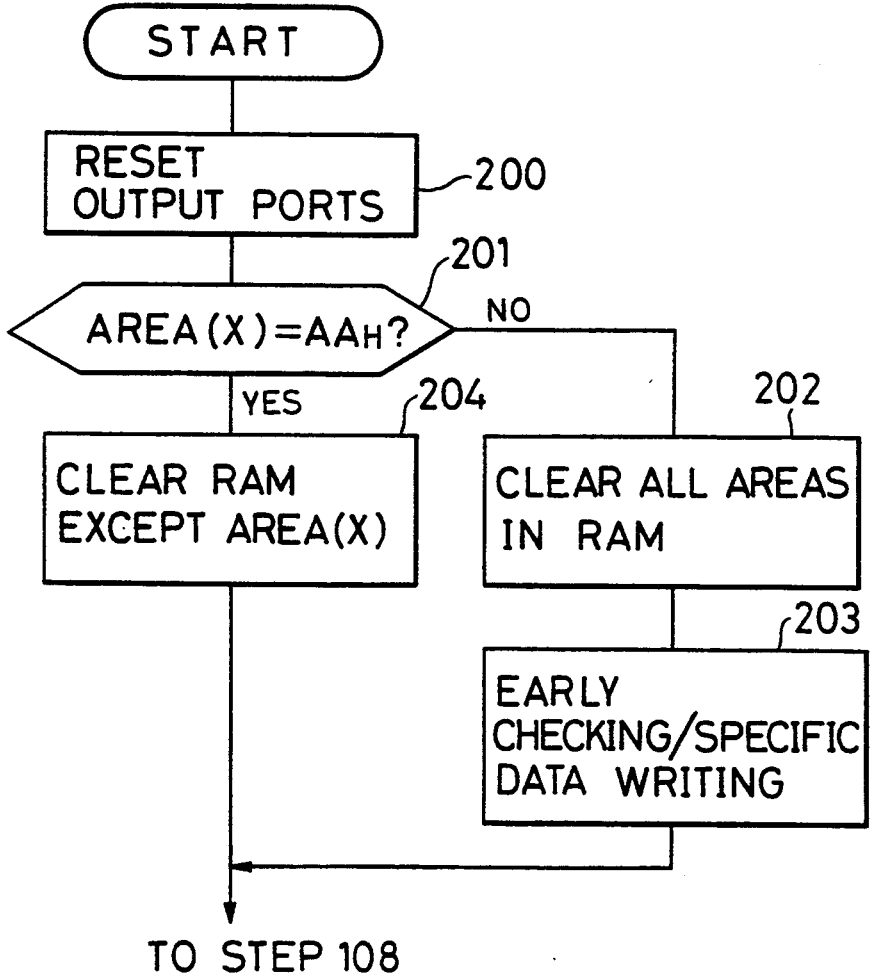

MALFUNCTION CHECKING CONTROL SYSTEM WHICH CHECKS IDENTIFICATION DATA STORED IN RAM

BACKGROUND OF THE INVENTION

This invention relates to a control system having a microcomputer for controlling, for example, a vehicle safety device and the like.

As disclosed in Japanese Laid-Open (Kokai) Patent Application No. 193743/1990, a control system for an air bag (vehicle safety device) basically comprises an acceleration sensor, a microcomputer, and a drive circuit for supplying an electric current to a squib for the air bag. The microcomputer comprises a read only memory (ROM) for storing a program there in, a random access memory (RAM) for temporarily storing therein a detected data, a processed data, etc., a CPU for effecting calculation, etc.

The microcomputer is operated to effect an acceleration evaluation. In other words, upon inputting of an acceleration signal from the acceleration sensor, the microcomputer integrates i t, and compares this integral value with a threshold value. This integral value represents a change in vehicle speed, and increases in the decelerating direction upon a collision of the vehicle. When the integral value increases in the decelerating direction, and exceeds the threshold value, the microcomputer judges that a collision has occurred, and outputs a trigger signal, thereby expanding the air bag.

The above Japanese Laid-Open Patent Application does not disclose a failure judgment function of the control system. However, it is well known that a control system of this type requires various kinds of failure judgments. Therefore, it was demanded that such failure judgments are performed effectively and without interrupting a normal control operation.

Referring to other prior art, U.S. Pat. Nos. 4,873,452 and 4,950,914 disclose, respectively, a failure judgment function of an acceleration sensor as one of the component elements of the control system. German Patent Publication No. 3,820,534 discloses a failure judgment which is executed by a microcomputer after the microcomputer is reset by means of power-on resetting or by a watch dog timer.

Referring to a further prior art, Japanese Laid-Open Patent Application No. 202,233/1986 discloses a control system comprising a microcomputer having a CPU, a RAM, and a ROM, a watch dog timer, and power-on reset means (including a switch, a resistor, and a condenser). After resetting, the microcomputer executes a routine. First, it is judged whether or not the data stored in a specific area of the RAM is in agreement with an identification data stored in the ROM.

In the case where the microcomputer is reset by the power-on reset means, the data stored, before resetting, in all areas of the RAM including the specific area is already broken or lost. Therefore, it is judged "NO" and the program proceeds. In the next step, all areas of the RAM are cleared, and the identification data stored in the ROM is written into the specific area of the RAM. Thereafter, a normal controlling operation is effected.

When the microcomputer is reset by the watch dog timer because of runaway of the microcomputer, the data stored, before resetting, in all areas of the RAM including the specific area, is not broken but maintained. Therefore, it is judged "YES" and then the program proceeds to the normal controlling procedure, skipping the above described step. In this case, the data stored in all areas of the RAM is not cleared but maintained. Therefore, continuity of the controlling operation is maintained.

In a control system of another Japanese Laid-Open Patent Application No. 18,851/1989, a microcomputer distinguishes a power-on resetting from a resetting made by a watch dog timer based on an output of a D-type flip-flop. This control system has a backup power source as an additional part. The microcomputer also judges whether or nor it has been backed up by the backup power source. As in the above Japanese Laid-Open Patent Application No. 202,233/1986, the RAM is cleared, or otherwise the data stored in the RAM before the microcomputer is reset, is maintained without clearing the RAM, both in accordance with the kind of the resetting means.

The above Japanese Laid-Open Patent Application Nos. 02,233/1989 and 18,851/1989 do not disclose any kind of failure judgments of the control system.

SUMMARY OF THE INVENTION

It is an object of the present invention to provide a control system capable of effecting a failure judgment effectively, and without disturbing a normal controlling operation thereof.

Another object of the present invention is to provide a control system having a function of failure judgment applicable to a vehicle safety device.

According to one aspect of the present invention, there is essentially provided a control system comprising a microcomputer, and reset means for outputting a reset instruction signal in order to reset the microcomputer, the microcomputer including:

(a) a RAM;
(b) judgment means for judging whether or not an identification data is stored in a specific area of the RAM after the microcomputer is reset responsive to the reset instruction signal;
(c) early checking means for effecting an early checking with respect to the control system when the judgment means judges "NO";
(d) write means for writing the identification data into the RAM after the judgment means makes a judgment; and
(e) control means for controlling an object to be controlled this control means being executed after the early checking is effected when the judgment means judges "NO", the control means being executed without effecting the early checking when the judgment means judges "YES".

According to another aspect of the present invention, there is also provided a control system for a vehicle safety device comprising an acceleration sensor, a microcomputer, and reset means for outputting a reset instruction signal in order to reset the microcomputer, the microcomputer including:

(a) a RAM;
(b) judgment means for judging whether or not an identification data is stored in a specific area of the RAM after the microcomputer i s reset responsive to the reset instruction signal;
(c) early checking means for effecting an early checking with respect to the control system when the judgment means judges "NO";

(d) write means for writing the identification data into the RAM after the judgment means makes a judgment; and (e) control means for controlling the vehicle safety device in accordance with an acceleration data from the acceleration sensor, this control means being executed after the early checking is effected when the judgment means judges "NO", the control means being executed without effecting the early checking when the judgment means judges "YES".

BRIEF DESCRIPTION OF THE DRAWINGS

FIG. 3 is a flow chart showing a modified embodiment of an acceleration evaluation executed by the microcomputer; and FIG. 4 is a flow chart showing a modified embodiment of an early stage of the main routine executed by the microcomputer.

DETAILED DESCRIPTION OF THE PREFERRED EMBODIMENTS

Figure 1:
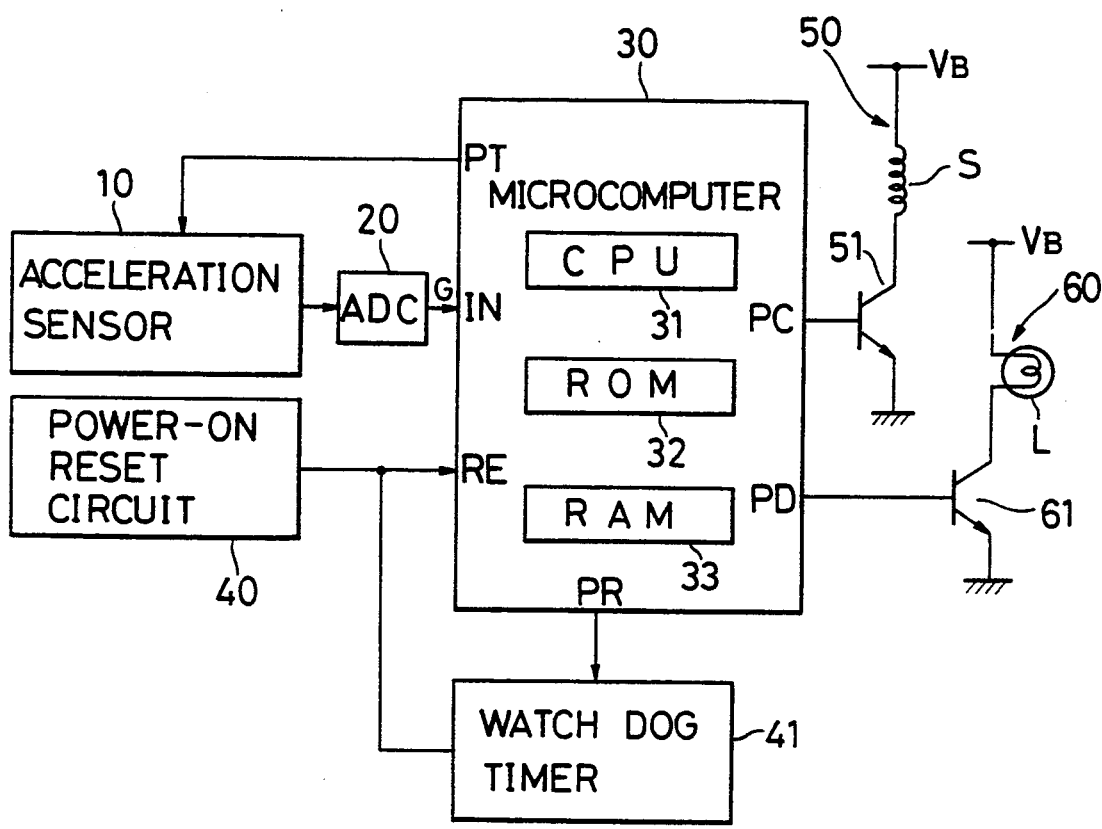
FIG. 1 is a circuit diagram schematically showing one embodiment of a control system according to the present invention.

One preferred embodiment of the present invention will now be described with reference to FIGS. 1 and 2. FIG. 1 shows a general construction of a control system for controlling a squib S of a vehicle safety device (for example, air bag). The control system comprises an acceleration sensor 10 having a piezoelectric device for detecting the acceleration of the vehicle, an analog-to-digital converter (ADC) 20 for converting an acceleration signal from the acceleration sensor 10 to a digital signal, a microcomputer 30 for processing the digital signal from the ADC converter 20, a power-on reset circuit 40 and a watch dog timer 41 both for resetting the microcomputer 30, a drive circuit 50 for driving the squib S, and another driving circuit 60 for actuating an alarm lamp L.

A constant voltage is supplied to the microcomputer 30 from a power source via a constant voltage circuit (not shown). This microcomputer 30 is of a one-chip type, and contains therein a CPU (central processing unit 31), a ROM (read only memory) 32, and a RAM (random access memory) 33. A program data, a threshold data, and an identification data, which will be described later, are stored in the ROM 32. On the other hand, a detected acceleration data, and a calculated or processed data are written, from time to time, into the RAM 33. In this embodiment, the identification data is written into a specific area of the RAM 33.

The microcomputer 30 comprises an input port IN for inputting the acceleration signal G from the ADC 20, a reset terminal RE, an output port PC for outputting a trigger signal when it is judged that a collision has occurred, as will be described later, an output port PD for outputting an alarm instruction signal when it detects that one of the acceleration sensor 10, etc. is abnormal, an output port PT for outputting a test pulse, and another output port PR for outputting a program-run signal.

The power-on reset circuit 40 outputs a reset instruction signal to the reset terminal RE of the microcomputer 30 responsive to the power-on. The watch dog timer 41 outputs a reset instruction signal to the reset terminal RE when it does not receive the program-run signal from the microcomputer 30 for a predetermined period of time because of runaway of the microcomputer 130. The control system further comprises a low voltage reset circuit (not shown). This low voltage reset circuit outputs a reset instruction signal to the reset terminal RE when it receives, from a voltage watch circuit (not shown), a detection signal indicating a decrease in voltage fed to the microcomputer 30.

The drive circuit 50 for driving the squib S comprises an emitter-grounded transistor 51. The squib S and an energy reservoir (not shown) formed of a condenser of a large capacity are connected between a collector of this transistor 51 and a battery $V_B$ in this order towards the battery $V_B$. When the trigger signal of a high level is outputted from the output port PC, the transistor 51 is turned on to ignite the squib S, thereby expanding the air bag.

The drive circuit 60 for actuating the alarm lamp L comprises an emitter-grounded transistor 61, and an alarm lamp L is connected between a collector of this transistor 61 and the battery $V_B$. When the alarm instruction signal of a high level is outputted from the output port PD, the transistor 61 is turned on to actuate the alarm lamp L, thereby telling the driver that one of the acceleration sensors 10, etc. is abnormal.

Figure 2:
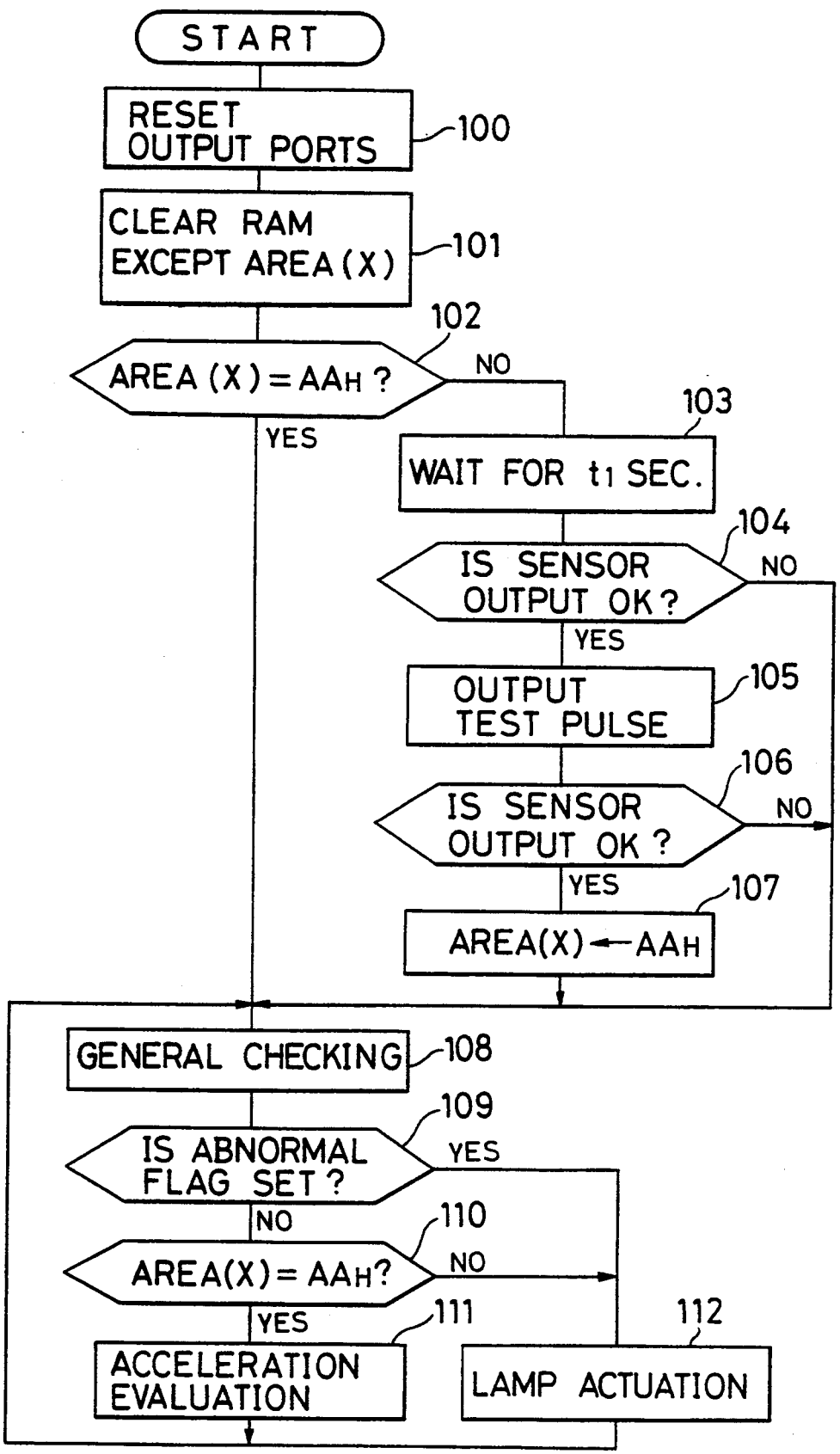
FIG. 2 is a flow chart showing a main routine executed by a microcomputer of FIG. 1.

When the reset terminal RE receives the reset instruction signal, the microcomputer 30 is reset to execute a main routine of FIG. 2. Specifically, first, all output ports are reset. In other words, all output ports are brought to a low level (Step 100). Then, all areas of the RAM 33 except the specific area (X) thereof (in other words, areas Nos., for example, 0 to 254 except a specific area No., for example, 255) are cleared (Step 101). Then, it is judged whether or not the data stored in the specific area (X) is an identification data $AA_H$ (Step 102).

In the case where the microcomputer 30 is reset by the power-on reset circuit 40, an electric power is not supplied to the microcomputer 30 before resetting, in other words, the microcomputer 30 is in a power-OFF condition before resetting, and therefore the data in the specific area (X) of the RAM 33 is already lost. Therefore, it is judged "NO" in Step 102, and an early checking is effected. More specifically, the microcomputer 30 waits for $t_1$ seconds from the time when it is powered on until the time when the output of the acceleration sensor 10 is raised to a normal voltage (Step 103). Then, it is judged whether or not the output of the acceleration sensor 10 is in a voltage level (for example, 2.5 V) representative of OG, in which level the vehicle is stopped (Step 104). If the judgment result in Step 104 is "YES", the test pulse is outputted to the acceleration sensor 10 (Step 105), and then it is judged whether or not the output of the acceleration sensor 10 is changed in response to the test pulse (Step 106). If the judgment result in Step 106 is "YES" (that is, the acceleration sensor 10 is normal), the identification data $AA_H$ is written into the specific area (X) (Step 107), and then the program proceeds to Step 108. If the judgment result in Step 104 is "NO", the program proceeds to Step 108, skipping Steps 105 to 107. Likewise, if the judgment result in step 106 is "NO", the program proceeds to Step 108, skipping Step 107.

As apparent from the above description, the identification data $AA_H$ is written into the specific area (X) in Step 107 only when the acceleration sensor 10 is normal.

In the case where the microcomputer 30 is reset by other reset means ( the watch dog timer 41, software resetting, etc. ) than the power-on reset circuit 40, the microcomputer 30 is not in a power-OFF condition before resetting, and the identification data $AA_H$ in the RAM 33 is not lost. Therefore, it is judged "YES" in Step 102. As a result, the early checking procedure in the above Steps 103 to 106 and the writing procedure of the identification data in Step 107 are not executed, and the program directly proceeds to Step 108.

In the case where the microcomputer 30 is reset by the low voltage resetting means, there are two courses for the microcomputer 30 to take in accordance with the voltage level fed to the microcomputer 30; in one course, all data in the RAM 33 is in a broken condition (that is, all data in the RAM 33 is already lost), and in the other course, all data of the RAM 33 is in a non-broken condition (that is, all data of the RAM 33 is still maintained). In the first-mentioned course, the early checking is effected because it is judged "NO" in Step 102. In the second-mentioned course, however, the early checking is not effected because it is judged "YES" in Step 102.

In Step 108, a general checking is effected with respect to the squib resistance, the power source voltage, the energy reservoir, etc. When it is judged in Step 108 that at least one of the squib resistance, etc. is abnormal, an abnormal flag is set. It is then checked whether or not this abnormal flag is set (Step 109). If it is judged that the abnormal flag is not set, it is then judged whether or not the data in the specific area (X) is in agreement with the identification data $AA_H$ (that is, whether or not the acceleration sensor 10 is normal) (Step 110). If the judgment result is "YES", an acceleration evaluation is effected (Step 111). In this acceleration evaluation, the microcomputer 30 reads the acceleration on constant time intervals, and then integrates it. When such obtained integral value of the acceleration increases in the decelerating direction and exceeds a threshold level, the trigger signal of a high level is outputted from the output port PC to ignite the squib S, thereby expanding the air bag.

When the squib resistance, etc. are normal and the acceleration sensor 10 is normal, too, the above Steps 108 to 111 are repeatedly executed because it is judged "NO" in Step 109 and "YES" in Step 110.

When it is judged either "YES" in Step 109 or "NO" in Step 110, the acceleration evaluation in Step 111 is not effected, and the alarm signal of a high level is outputted from the output port PD to actuate the alarm lamp L (Step 112).

As discussed above, only when the microcomputer 30 is reset by the power-on reset means, the early checking (that is, failure judgment of the acceleration sensor 10) is effected. The failure judgment of the acceleration sensor 10 cannot be effected when the vehicle is running. The power-on resetting is effected only when the vehicle is stopped, and therefore the failure judgment of the acceleration sensor 10 can be effected. Although the acceleration evaluation cannot be effected when the failure judgment of the acceleration sensor 10 is undergoing, there will be no problem because the air bag is not required to be expanded when the vehicle is stopped.

In the case where the microcomputer 30 is reset by means of the watch dog timer 41, etc. (this resetting is occurrable even when the vehicle is running), the early checking (failure judgment of the acceleration sensor 10) is not effected. As a result, the acceleration evaluation can be effected without any interruption, so that the air bag would always be ready to be expanded. The general checking in Step 108 can be effected even during the running of the vehicle without any difficulty.

In the case where it is judged, by mistake, in Steps 104 and 106 that the acceleration sensor 10 is abnormal due to noise, etc. when the sensor 10 is actually not abnormal, the acceleration evaluation is not effected. In this case, it is judged "NO" in Step 102 of the main routine after the next resetting (this resetting includes not only the power-on resetting but also all other resettings), and therefore the early checking is effected again in Steps 103 to 106. When the acceleration sensor 10 is found to be normal in the early checking, it is judged "YES" in the Steps 104 and 106, and therefore the identification data $AA_H$, can be written into the specification (X). As a result, the acceleration evaluation can be effected thereafter.

The above Step 111 for effecting the acceleration evaluation in the main routine of FIG. 2 may be deleted. Instead, a timer interrupt routine of FIG. 3 is executed. More specifically, first, it is judged whether or not the data in the specific area (X) is in agreement with the identification data $AA_H$ (Step 120). Only when it is judged "YES" in Step 120, the acceleration evaluation is effected (Step 121). The reason is that when the identification data is stored in the specific area (X), and it indicates that the early checking is not ocurring.

FIG. 4 shows a modified embodiment of the early stage of the main routine. Specifically, the output ports are reset first (Step 200), and then it is judged whether the data in the specific area (X) of the RAM 33 is in agreement with the identification data $AA_H$ (Step 201). If the judgment result is "NO", all areas of the RAM 33 are cleared (Step 202). Thereafter, both the early checking and writing of the identification data $AA_H$ are effected (Step 203 ), and then the program proceeds to Step 108 of FIG. 2. The Step 203 corresponds to Steps 103 to 107 of FIG. 2. If the judgment result in Step 201 is "YES", the RAM 33 is only cleared except for the specific area (X) (Step 204), and then the program proceeds to Step 108.

In the modified embodiment of FIG. 4, a second specific area for storing the voltage level of the acceleration sensor when the acceleration is zero, may be set to the RAM in addition to the specific area (X) for writing the identification data $AA_H$. In Step 204, the RAM 33 may be cleared except for both the specific area (X) and second specific area. In this case, the acceleration data is obtained in the acceleration evaluation (Step 111 of FIG. 2) based on a difference between the voltage level at zero in acceleration, stored before resetting, and the voltage level of the acceleration sensor inputted after resetting. The voltage level at zero in acceleration may be slightly changed due to environmental temperature, etc. However, there can be obtained a highly reliable acceleration data by utilizing the data of the voltage level at zero in acceleration before resetting.

Furthermore, in the modified embodiment of FIG. 4, the Step 204 may be omitted. In this case, all data in the RAM immediately before resetting can be continuously used.

The present invention is not limited to the above embodiments, and various modifications can be made. For example, in the above embodiments, the early checking procedure may include such procedures as checking the lamps, switches, drive transistors, etc.

After it is judged whether or not the data in the specific area of the RAM is in agreement with the identification data, the identification data may be written into the specific area of the RAM before the early checking is effected. Alternatively, the identification data may be unconditionally written into the specific area of the RAM after the early checking is effected irrespective of the result of the early checking. In this case, the result of the early checking is written into one of the remaining areas of the RAM.

The microcomputer may comprise a one-chip microcomputer, and an exterior RAM. The number of the RAM may be plural.

The control system of the present invention can be applied to other vehicle safety devices, such as a pretensioner of a seat belt, or other objects to be controlled.

What is claimed is:

1. A control system for a vehicle safety device comprising:
    an acceleration sensor;
    a microcomputer; and
    reset means for outputting a reset instruction signal in order to reset said microcomputer,
    said reset means including a power-on reset circuit and a watch dog timer and
    said microcomputer comprising:
    (a) a RAM;
    (b) first judgment means for judging whether or not an identification data is stored in a specific area of said RAM after said microcomputer is reset responsive to the reset instruction signal;
    (c) failure judgment means for judging whether or not said acceleration sensor is subjected to a failure when said first judgment means judges "NO" that there are no identification data stored in the specific area of said RAM;
    (d) writing means for writing the identification data into the specific area of said RAM when said first judgment means judges "NO"; and
    (e) acceleration evaluation means for integrating an acceleration data from said acceleration sensor to obtain an integral value, judging whether or not a collision of said vehicle has occurred based on said integral value, and outputting a trigger signal to activate said vehicle safety device when said acceleration evaluation means judges that a collision of said vehicle has occurred; said acceleration evaluation means being executed after said failure judgment means is effected when said first judgment means judges "NO", said acceleration evaluation means being executed without said failure judgment means being effected when said first judgment means judges "YES", that there are identification data stored in the specific area of said RAM.

2. A control system as claimed in claim 1, in which said writing means writes the identification data into the specific area of said RAM only when said failure judgment means judges that said acceleration sensor is normal.

3. A control system as claimed in claim 2, further comprising an alarm lamp, said microcomputer further including means for outputting an instruction signal for actuating said alarm lamp when the identification data is not stored in said RAM.

4. A control system as claimed in claim 1, in which said acceleration evaluation means is executed subject to a condition that the identification data is stored in said RAM.

5. A control system as claimed in claim 4, wherein said first judgment means, said failure judgment means and said writing means execute in a single routine, and said acceleration evaluation means executes in a timer interrupt routine independent of said single routine.

6. A control system as claimed in claim 1, in which said failure judgment means of said acceleration sensor includes means for judging whether or not said acceleration sensor is subjected to a failure based on an output level of said acceleration sensor at zero in acceleration.

7. A control system as claimed in claim 1, in which said failure judgment means of said acceleration sensor includes means for outputting a test pulse to said acceleration sensor, and means for judging whether or not said acceleration sensor is subjected to a failure based on the output of said acceleration sensor responsive to the test pulse.

* * * * *